(12) United States Patent
Chandrasekar et al.

(10) Patent No.: US 9,667,269 B2
(45) Date of Patent: May 30, 2017

(54) TECHNIQUE FOR COMPRESSING XML INDEXES

(75) Inventors: Sivasankaran Chandrasekar, Menlo Park, CA (US); Nipun Agarwal, Santa Clara, CA (US)

(73) Assignee: Oracle International Corporation, Redwood Shores, CA (US)

( * ) Notice: Subject to any disclaimer, the term of this patent is extended or adjusted under 35 U.S.C. 154(b) by 649 days.

(21) Appl. No.: 12/791,337

(22) Filed: Jun. 1, 2010

(65) Prior Publication Data

US 2011/0295817 A1 Dec. 1, 2011

(51) Int. Cl.
*G06F 17/30* (2006.01)
*H03M 7/30* (2006.01)
*G06F 7/00* (2006.01)

(52) U.S. Cl.
CPC ........ *H03M 7/30* (2013.01); *G06F 17/30914* (2013.01)

(58) Field of Classification Search
None
See application file for complete search history.

(56) References Cited

U.S. PATENT DOCUMENTS

| | | | |
|---|---|---|---|
| 5,263,145 A | 11/1993 | Brady et al. | |
| 5,404,510 A | 4/1995 | Smith et al. | |
| 5,506,979 A | 4/1996 | Menon | |
| 5,546,575 A | 8/1996 | Potter et al. | |
| 5,699,457 A | 12/1997 | Adar et al. | |
| 5,794,228 A | 8/1998 | French | |
| 5,794,229 A | 8/1998 | French et al. | |
| 5,867,723 A | 2/1999 | Chin et al. | |
| 5,995,080 A | 11/1999 | Biro et al. | |
| 6,216,125 B1 | 4/2001 | Johnson | |
| 6,643,633 B2 * | 11/2003 | Chau et al. | |
| 6,959,300 B1 | 10/2005 | Caldwell et al. | |
| 6,973,452 B2 | 12/2005 | Metzger | |
| 7,031,994 B2 | 4/2006 | Lao et al. | |
| 7,079,056 B2 | 7/2006 | Weaver | |
| 7,469,266 B2 | 12/2008 | Gustavson et al. | |
| 7,496,589 B1 * | 2/2009 | Jain et al. | |
| 7,552,130 B2 | 6/2009 | Cook et al. | |
| 7,552,218 B2 | 6/2009 | Kaluskar et al. | |
| 7,558,290 B1 | 7/2009 | Nucci et al. | |
| 7,590,641 B1 | 9/2009 | Olson | |
| 7,693,325 B2 | 4/2010 | Pulla et al. | |
| 7,707,194 B2 | 4/2010 | Bresch et al. | |

(Continued)

OTHER PUBLICATIONS

U.S. Appl. No. 12/769,205, filed Apr. 28, 2010, Office Action, Dec. 6, 2011.

(Continued)

*Primary Examiner* — Usmaan Saeed
*Assistant Examiner* — Yu Zhao
(74) *Attorney, Agent, or Firm* — Kickman Palermo Becker Bingham LLP

(57) ABSTRACT

A database server exploits the power of compression and a form of storing relational data referred to as column-major format, to store XML documents in shredded form. The column values that are to be stored for shredded XML documents are separately analyzed for a XML document to determine whether to store a particular column in column-major format or row-major format, and what compression technique to use, if any.

15 Claims, 2 Drawing Sheets

(56) References Cited

U.S. PATENT DOCUMENTS

| | | | |
|---|---|---|---|
| 7,720,878 | B2 | 5/2010 | Caldwell et al. |
| 8,060,476 | B1 | 11/2011 | Afonso |
| 8,099,440 | B2 | 1/2012 | Johnson et al. |
| 8,296,517 | B2 | 10/2012 | Potapov et al. |
| 8,392,382 | B2 | 3/2013 | Marwah et al. |
| 8,583,692 | B2 | 11/2013 | Ganesh et al. |
| 8,645,337 | B2 | 2/2014 | Kapoor et al. |
| 8,700,579 | B2 | 4/2014 | Apanowicz |
| 8,832,142 | B2 | 9/2014 | Marwah et al. |
| 2003/0028509 | A1 | 2/2003 | Sah |
| 2003/0212694 | A1 | 11/2003 | Potapov et al. |
| 2004/0033803 | A1 | 2/2004 | Varonen et al. |
| 2004/0034616 | A1 | 2/2004 | Witkowski |
| 2004/0139099 | A1 | 7/2004 | Weaver |
| 2005/0210054 | A1 | 9/2005 | Harris |
| 2007/0033354 | A1 | 2/2007 | Burrows |
| 2007/0061544 | A1 | 3/2007 | Uppala |
| 2007/0109155 | A1 | 5/2007 | Fallon |
| 2008/0010240 | A1 | 1/2008 | Zait |
| 2008/0050025 | A1 | 2/2008 | Bashyam et al. |
| 2008/0071818 | A1 | 3/2008 | Apanowicz et al. |
| 2008/0098048 | A1 | 4/2008 | Cao et al. |
| 2008/0162521 | A1 | 7/2008 | Browning |
| 2008/0162523 | A1 | 7/2008 | Kraus et al. |
| 2008/0294676 | A1 | 11/2008 | Faerber et al. |
| 2008/0294863 | A1 | 11/2008 | Faerber et al. |
| 2009/0006399 | A1* | 1/2009 | Raman et al. ............ 707/7 |
| 2009/0019029 | A1 | 1/2009 | Tommaney |
| 2009/0106210 | A1 | 4/2009 | Slezak et al. |
| 2009/0106281 | A1 | 4/2009 | Marwah et al. |
| 2009/0254516 | A1 | 10/2009 | Meiyyappan |
| 2009/0287737 | A1 | 11/2009 | Hammerly |
| 2010/0042587 | A1* | 2/2010 | Johnson et al. ............ 707/3 |
| 2010/0088315 | A1 | 4/2010 | Netz |
| 2010/0161567 | A1 | 6/2010 | Makela |
| 2010/0278446 | A1 | 11/2010 | Ganesh et al. |
| 2010/0281004 | A1 | 11/2010 | Kapoor et al. |
| 2010/0281079 | A1 | 11/2010 | Marwah et al. |
| 2011/0029569 | A1 | 2/2011 | Ganesh et al. |
| 2011/0040771 | A1 | 2/2011 | Gilyadov |
| 2011/0047330 | A1 | 2/2011 | Potapov et al. |
| 2011/0295817 | A1 | 12/2011 | Chandrasekar et al. |
| 2012/0117038 | A1 | 5/2012 | Ganesh et al. |
| 2012/0143833 | A1 | 6/2012 | Ganesh et al. |
| 2013/0036101 | A1 | 2/2013 | Marwah |
| 2015/0381647 | A1 | 12/2015 | Huang |

OTHER PUBLICATIONS

U.S. Appl. No. 12/617,669, filed Nov. 12, 2009, Restriction Requirement, Jan. 3, 2012.

Sybase IQ, "Administration Guide", Document ID: 35375-01-1121-02, dated Sep. 19, 1997, 426 pages.

D. Florescu et al. "Storing and Querying XML Data Using an RDBMS", Quarterly Bulletin of the Computer Society of the IEEE Technical Committee on Data Engineering, vol. 22, No. 3, Sep. 1, 1999, 8 pages.

Daniel J. Abadi, "Query Execution in Column-Oriented Database Systems", Feb. 29, 2008, retrieved from Internet http://cs-www.yale.edu/homes/dna/papers/abadiphd.pdf, 148 pgs.

U.S. Appl. No. 12/769,205, filed Apr. 28, 2010, Final Office Action, May 22, 2012.

Rabb, David, "How to Judge a Columnar Database", Information Management, website http://license.icopyright.net/user/viewFreeUse.act?fuid=MTMxMDAzMjU%3D, dated Dec. 14, 2007, 2 pages.

MacNicol Roger et al, "Sybase IQ Multiplex-Designed for Analytics", Proceedings of the 30$^{th}$ VLDB Conference, dated 2004, 4 pages.

Sybase IQ, "Administration Guide", Document ID: 35375-10-1121-02, dated Sep. 19, 1997, 426 pages.

Sybase IQ, "Gaining the Performance Edge Using a Column-Oriented Database Management System", 12 pages, dated Mar. 2009.

Sybase IQ, "An Advanced Columnar Data Warehouse Architecture", Winter Corporation, 17 pages, Dated Jun. 2010.

Winter Corporation, "Demonstrating Efficiency in Large-Scale Data Warehousing", A review of new TPC-H results for the Sun-Sybase IQ Platform, 20 pages, dated in 2003.

Loshin, D., "Gaining the Performance Edge Using a Column-Oriented Database Management System" (2009), 12 pages.

"C-Store: A Column-Oriented DBMS" downloaded from the Internet Apr. 1, 2010 < http://db.csail.mit.edu/projects/cstore/#papers > 4 pages.

Stonebraker, M. et al., "C-Store: A Column-oriented DBMS", Proceedings of the 31$^{st}$ VLDB Conference, Trondheim, Norway 2005 (12 pages).

Abadi, D. et al., "Integrating Compression and Execution in Column-Oriented Database Systems" Sigmod 2006 (12 pages).

U.S. Appl. No. 12/871,882, filed Aug. 30, 2010.

U.S. Appl. No. 12/871,882, filed Aug. 30, 2010, Office Action, Apr. 25, 2012.

U.S. Appl. No. 12/871,882, filed Aug. 30, 2010, Final Office Action, Nov. 2, 2012.

U.S. Appl. No. 13/229,641, filed Sep. 9, 2011, Office Action, Nov. 26, 2012.

U.S. Appl. No. 12/617,669, filed Nov. 12, 2009, Office Action, Sep. 19, 2013.

U.S. Appl. No. 12/769,206, filed Apr. 28, 2010, Notice of Allowance, Jul. 29, 2013.

U.S. Appl. No. 12/617,669, filed Nov. 12, 2009, Notice of Allowance, Mar. 13, 2014.

U.S. Appl. No. 13/631,575, filed Sep. 28, 2012, Final Office Action, Jan. 12, 2016.

Ailamaki, Anastassia, et al, "Weaving Relations for Cache Performance," Proceedings of the 27$^{th}$ International Conference on Very Large Data Bases, Rome, Italy, Sep. 11-14, 2001, 14 pages.

Elmasri, et al., "Fundatmentals of Database Systems," Third Edition, Addison-Wesley Longman, Inc., Copyright © 2000, ISBN-0-8053-1755-4, pp. 32, 70, 118, 131-132, 134, 155-159, 170, 252-254, 558, 569-573, 591-592, and 789-790 (26 pgs).

U.S. Appl. No. 13/631,575, filed Sep. 28, 2012, Interview Summary, Jun. 27, 2016.

U.S. Appl. No. 13/631,575, filed Jun. 28, 2012, Advisory Action, Jul. 15, 2016.

The United States Patent Trademark Office, *Realtime Data LLC* v. *Oracle International Corporation*, "Decision" dated Sep. 13, 2016, 29 pages.

U.S. Appl. No. 13/631,575, filed Sep. 28, 2012, Decision on Appeal, Sep. 23, 2016.

U.S. Appl. No. 13/631,575, filed Sep. 28, 2012, Office Action, Jul. 20, 2015.

Kapoor, U.S. Appl. No. 14/079,507, filed Nov. 13, 2013, Office Action, mailing date Dec. 14, 2016.

* cited by examiner

TECHNIQUE FOR COMPRESSING XML INDEXES

CROSS-REFERENCE TO RELATED APPLICATIONS; BENEFIT CLAIM

This application is related to: (1) U.S. application Ser. No. 12/769,508, filed Apr. 28, 2010 by Vineet Marwah, et. al., entitled Compression Analyzer, (2) U.S. application Ser. No. 12/769,205, filed Apr. 28, 2010 by Vikram Kapoor, et. al., entitled Storing Compression Units In Relational Tables, (3) U.S. application Ser. No. 12/617,669, filed Nov. 12, 2009, by Amit Ganesh, et. al., entitled Structure of Hierarchical Compressed Data Structure for Tabular Data, and (4) Provisional Appln. 61/174,447, filed Apr. 30, 2009. The content of all the patent applications mentioned in this paragraph are incorporated herein by reference. The applicant(s) hereby rescind any disclaimer of claim scope in the parent application(s) or the prosecution history thereof and advise the USPTO that the claims in this application may be broader than any claim in the parent application(s).]

FIELD OF THE INVENTION

The present invention relates to database systems, and in particular, storing XML data in database systems more efficiently.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Extensible Markup Language (XML) is a World Wide Web Consortium (W3C) standard for representing data. Many applications are designed to output data in the form of XML documents. XML data comprises structured data items that form a hierarchy. In XML, data items known as elements are delimited by an opening tag and a closing tag. An element may also comprise attributes, which are specified in the opening tag of the element. Text between the tags of an element may represent any sort of data value, such as a string, date, or integer. An element may have one or more children. The resulting hierarchical structure of XML-formatted data is discussed in terms akin to those used to discuss a family tree. For example, a sub-element is said to descend from its parent element or any element from which its parent descended. A parent element is said to be an ancestor element of any sub-element of itself or of one of its descendant elements. Collectively, an element along with its attributes and descendants, are referred to as a tree or a sub-tree.

With the rise and popularity of XML, many relational database systems have added support for storing, managing and querying XML content. The term relational database system refers to any database system that supports the relational model of data processing, including database systems that may support other models of data processing, such as object-relational and various models the XML standard (e.g. XQuery, XPath)

Relational database systems that store XML documents may store individual elements in separate rows of a table. Such documents are referred to herein as shredded documents. The process of dividing an XML document into discrete element values (or representations thereof) for storage in the rows that hold the data representing the XML document and/or nodes thereof is referred to as shredding the XML document.

A shredded version of a XML document may have much a larger storage footprint than that of the XML documents stored in other forms, such as text based file storage. There is a thus a need to store shredded XML documents more efficiently.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
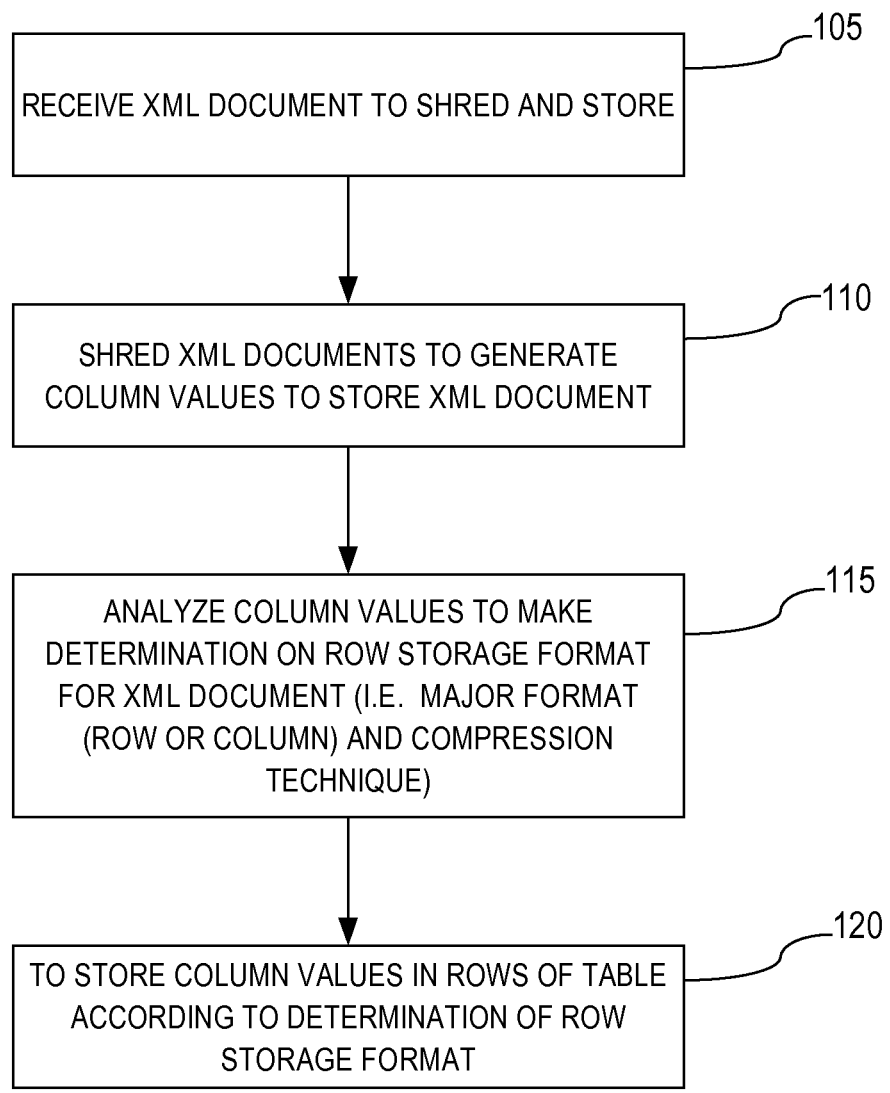
FIG. 1 depicts a procedure for separately analyzing the column values generated for a XML document and determining a major format and compression technique, according to an embodiment of the present invention.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

General Overview

Described in here are mechanisms for more efficiently storing shredded XML documents. The mechanisms exploit the power of compression and a form of storing relational data referred to as column-major format, to store XML documents in shredded form. The column values that are to be stored for shredded XML documents are separately analyzed for each XML document to determine whether to store a particular column in column-major format and what compression technique to use, if any.

Data in a database is stored persistently in persistent storage units having one of a set of enumerated sizes. (e.g. 4 k data blocks, 32 k data blocks). There are several forms of storing rows in persistent storage units: row-major and column-major. In row-major format, column values of a single row are stored contiguously within a unit of persistent storage, such as a data block. In column-major format, values of a column of multiple rows are stored contiguously. Row-major format or column-major format are collectively referred to herein as major formats.

Column-major format has the advantage that it permits better compressibility. The values within a column may have common properties such that, when the values are stored contiguously, the common properties can be exploited using various compression techniques. The major format of a column and the compression technique used, if any, is referred to herein as a storage format.

According to an embodiment of the present invention, when shredding an XML document, the column values to store in rows that will hold the shredded XML document are analyzed to determine the storage format, i.e. whether and/or how to store the rows in row-major or column-major format, and what compression technique to apply, if any. In this way, the column values for a column and particular XML document are separately analyzed to determine a storage format for the rows that hold that XML document's data.

An embodiment of the present invention is illustrated within the context of a database system that supports relational storage, querying and manipulation of data and supports storage and querying of XML data according to XML standards. Therefore, a description of such database systems is useful.

Database Systems

A database management system ("DBMS") manages a database. A database management system may comprise one or more database servers. A database comprises database data and metadata that is stored on a persistent memory mechanism, such as a set of hard disks. Metadata defines database objects, such as relational tables, table columns, view, and triggers.

Database applications and clients interact with a database server by submitting to the database server commands that cause the database server to perform operations on data stored in a database. A database command may be in the form of a database statement that conforms to a database language. A language for expressing database requests is the Structured Query Language (SQL). There are many different versions of SQL, some versions are standard and some proprietary, and there are a variety of extensions. SQL data definition language ("DDL") instructions are issued to a database server to create or configure database objects, such as tables, views, or complex data types. SQL/XML is a common extension of SQL used when manipulating XML data in an object-relational database. Although the examples are described based on Oracle's SQL, the techniques provided herein are not restricted to any particular version of SQL.

XML Storage

Various types of storage mechanisms are used to store a XML document. One type of storage mechanism stores a XML document as a text file in a file system. As mentioned previously, another type of mechanism for storing XML documents is a database server. In a database server, a XML document may be stored in a row of a table and nodes of the XML document are stored in separate columns in the row. An entire XML document may also be stored in a lob (large object) in a column. A XML document may be shredded and stored as a hierarchy of objects in a database; each object is an instance of an object class and stores one or more elements of a XML document. Tables and/or objects of a database system that hold XML data are referred to herein as base tables or objects.

Binary-encoded XML is another form in which XML data may be stored in a database. Binary-encoded XML is a compact binary representation of XML that was designed to reduce the size of XML documents. One of the ways binary-encoded XML compresses data is by representing strings ("tokens") with fixed values.

XML Index

Database servers that store XML data may include many mechanisms that allow for powerful and efficient ways to query large collections of XML documents. Database servers that store XML documents may be enhanced to efficiently perform XML operations using these mechanisms. A database server may maintain a "logical index", referred to herein as a XML index, that indexes a collection of XML documents.

An XML index contains multiple structures that are cooperatively used to access a collection of XML documents. One such structure is a relational table that stores shredded documents. Such a relational table is used to illustrate an embodiment of the present invention.

Specifically, an XML index may include a table referred to as a path table. The path table stores shredded documents, which are referred to herein as indexed documents. Each row of the path table contains data for a node of an indexed document. Not all nodes of an indexed document have a corresponding row in the path table.

Each path table row contains multiple columns, each column of a row containing a piece of information associated with a node. Some of the values of columns are amenable to compression under column-major format.

According to an embodiment, the columns of a path table include a column for (1) a PATHID that indicates the path to the node, (2) "location data" for locating the fragment data for the node within the base structures, and (3) "hierarchy data" that indicates the position of the node within the structural hierarchy of the XML document that contains the node. Optionally, the PATH table may include a column that contains value information for those nodes that are associated with values. Each of these types of information shall be described in greater detail below.

Path IDs

According to an embodiment, each of the indexed XML paths is assigned a unique path ID. For example, the paths that exist in po1.xml and po2.xml may be assigned path IDs as illustrated in the following table:

| PATH ID | PATH |
|---|---|
| 41 | /PurchaseOrder |
| 41.54 | /PurchaseOrder/Reference |
| 41.34 | /PurchaseOrder/Actions |
| 41.34.33 | /PurchaseOrder/Actions/Action |
| 41.34.33.77 | /PurchaseOrder/Actions/Action/User |

Various techniques may be used to identify paths and assign path IDs to paths.

Location Data

The location data associated with a node indicates where the XML document that contains the node resides within the base structures. Thus, the nature of the location data will vary from implementation to implementation based on the nature of the base structures. Depending on how the actual XML document is stored, the location data may also include a locator or logical pointer to point into the XML document. The logical pointer may be used for extracting fragments that are associated with nodes identified by XPaths.

Hierarchy Data

The PATH table row for a node also includes information that indicates where the node resides within the hierarchical structure of the XML document containing the node. Such hierarchical information is referred to herein as the "OrderKey" of the node.

According to one embodiment, the hierarchical order information is represented using a Dewey-type value. Specifically, in one embodiment, the OrderKey of a node is created by appending a value to the OrderKey of the node's immediate parent, where the appended value indicates the position, among the children of the parent node, of that particular child node.

According to one embodiment, the composite numbers represented by each OrderKey are converted into byte-comparable values, so that a mathematical comparison between two OrderKeys indicates the relative position, within the structural hierarchy of an XML document, of the nodes to which the OrderKeys correspond.

Value Information

Some nodes within an indexed document may be attribute nodes or nodes that correspond to simple elements. According to one embodiment, for attribute nodes and simple elements, the PATH table row also stores the actual value of the attributes and elements. Such values may be stored, for example, in a "value column" of the PATH table. The secondary "value indexes", which shall be described in greater detail hereafter, are built on the value column.

Path Table Example

An embodiment of the present invention is illustrated with a path table example that includes columns defined as follows:

| Column Name | Datatype | Description |
| --- | --- | --- |
| PATHID | RAW(8) | ID for the path token. Each distinct path e.g. /a/b/c is assigned a unique id by the system. |
| RID | UROWID/ ROWID | Rowid of the row in base table. |
| ORDER_KEY | RAW(100) | Dewey order key for the node e.g. 3.21.5 to indicate $5^{th}$ child of $21^{st}$ child of $3^{rd}$ child of root. |
| LOCATOR | RAW(100) | Information corresponding to the starting position for the fragment. This is used during fragment extraction. |
| VALUE | RAW(2000)/ BLOB | Value of the node in case of attributes and simple elements. The type can be specified by the user (as well as the size of the RAW column) |

As explained above, the PATHID is a number assigned to the node, and uniquely represents a fully expanded path to the node. The ORDER_KEY is a system representation of the DEWEY ordering number associated with the node. The VALUE column stores the effective text value for simple element (i.e. no element children) nodes and attribute nodes.

The path table example shall be given hereafter with reference to the following two illustrative XML documents:
po1.xml

```
<PurchaseOrder>
  <Reference>SBELL-2002100912333601PDT</Reference>
  <Actions>
    <Action>
       <User>SVOLLMAN</User>
    </Action>
  </Actions>
  . . . .
</PurchaseOrder>
``` po2.xml

```
<PurchaseOrder>
  <Reference>ABEL-20021127121040897PST</Reference>
  <Actions>
    <Action>
       <User>ZLOTKEY</User>
    </Action>
    <Action>
       <User>KING</User>
    </Action>
  </Actions>
  . . . .
</PurchaseOrder>
```

The following table is an example of rows of the path table example that are populated with entries for po1.xml and po2.xml. Specifically, each row of the PATH table corresponds to an indexed node of either po1.xml or po2.xml.

| | Pathid | Rid | Order-Key | Loca-tor | Value |
| --- | --- | --- | --- | --- | --- |
| POPULATED PATH TABLE EXMAMPLE | | | | | |
| 1 | 41 | 346.1.27 | 1 | | |
| 2 | 41.54 | 346.1.27 | 1.1 | | SBELL-2002100912333601PDT |
| 3 | 41.34 | 346.1.97 | 1.2 | | |
| 4 | 41.34.33 | 346.1.97 | 1.2.1 | | |
| 5 | 41.34.33.77 | 346.1.97 | 1.2.1.1 | | SVOLLMAN |
| 6 | 41 | 346.2.97 | 1 | | |
| 7 | 41.54 | 346.2.97 | 1.1 | | ABEL-20021127121040897PST |
| 8 | 41.34 | 346.2.27 | 1.2 | | |
| 9 | 41.34.33 | 346.2.27 | 1.2.1 | | |
| 10 | 41.34.33.77 | 346.2.27 | 1.2.1.1 | | ZLOTKEY |
| 11 | 41.34.33 | 346.2.27 | 1.2.2 | | |
| 12 | 41.34.33.77 | 346.2.27 | 1.2.2.1 | | KING |

In this example, rows 1-5 store a shredded version of po1.xml. Rows 6-12 store a shredded version of po2.xml. In the base table that stores these XML documents, both documents are stored in same block 346, but in different rows within the block.

When column values of certain columns in the path table are stored contiguously within a data block, the common properties between the values may be exploited for compression. For example, the values in RID are amenable to Run Length Coding (RLC). Run-length coding is a very simple form of data compression in which runs of data (that is, sequences in which the same data value occurs in many consecutive data symbols) are stored as a single data value and count, rather than as the original run. In addition, different compression techniques may be used for the same column for different XML documents. In XML documents where the same path appears frequently, a run-length encoded schema might be used. In highly nested documents, in which the same path prefix is shared by numerous nodes, a prefix based compression schema might be more efficient. All Path IDs with the same prefix are compressed by storing the prefix just once.

Compression Units

As mentioned earlier, data in a database is stored persistently in persistent storage units (e.g. data blocks) having one of a set of enumerated sizes. According to an embodiment of the present invention, the storage units are referred to herein as compression units. Compression units are highly flexible structures for physically storing tabular data, such as rows of a table.

According to an embodiment, each compression unit stores data for all columns of the corresponding table. For example, if a table has twenty columns, then each compression unit for that table will store data for different rows, but each of those rows will have data for all twenty columns. Within the compression unit, data may be stored in column-major format, or row-major format.

However, for a set of rows in a table, data for the rows may be divided among compression units based on columns. Thus, some compression units may store data for a first column of the table in column-major format, some may store data for a second column of the table in column major format, while other compression units store data for the third and fourth columns of the table in row-major format. In such an embodiment, a single row of the table may be spread among several compression units. Importantly, compression units that store data first column may use different compression algorithm than that used to compress data in the compression units that hold the second column. Further details on compression units can be found in *Structure of Hierarchical Compressed Data Structure for Tabular Data*.

According to an embodiment of the present invention, while shredding an XML document to store in a path table, the values to be stored in a particular column are examined and analyzed to determine what major format to use, and what if any compression technique to use. All column values for each column in the table are examined. In this way, an individual XML document is separately analyzed to determine a storage format specific to the XML document.

FIG. 1 is a diagram that depicts such a procedure for shredding an XML document and determining a storage format. According to an embodiment, the steps may be performed by a database server that has been enhanced to handle XML storage. The steps are illustrated in the context of loading an XML document in a path table.

Referring to FIG. 1, at 105, a database server receives a XML document to store in shredded form.

At 110, the database server shreds the XML document to generate values to store in the XML index. For each node to store therein, the column values for a row are generated. These include columns values for columns PATHID, RID, ORDER_KEY, LOCATOR, VALUE.

At 115, the database server analyzes the column values to determine the row storage format for the rows, that is, to use row-major format for one or more or all of the columns, whether to use column-major format for one or more of the columns, and what compression technique to use. For example, for a large document stored in a base table, there are a lot of nodes to store in the path table that all have the same value for RID column. Therefore, column-major format using run length compression is used. For the PATH ID column, there may be a large subtree with nodes whose path ascends through the same root and an immediate descendant node. The column for PATH ID may be stored in column-major format using, for example, run-length or compression prefix-based compression, as mentioned earlier. In cases where a single number denotes the entire path, any standard number compression scheme (run length encoding of the digits, binary values etc) can be applied.

At 120, the database server stores the column values in a database according to the storage format determined at step 115. In an embodiment, the rows are stored using a row-batch insert function or procedure that is invoked to store a batch of rows into the same set of compression units. The compression units are a form of data blocks in the database. The data blocks are only populated with the rows in the batch. The row-batch insert function accepts parameters for controlling the major format of specific columns, and the compression technique to use.

Using the techniques described herein for document-specific storage formatting, storage formats of different XML documents stored in a path table may differ. Rows for one XML document may all be stored in row-major format. For a second XML document, rows may have columns that are each in column-major format. For the rows that store a third XML document, the same columns as for the second document are stored in column-major format, but are compressed using at one least one different compression technique.

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 2:
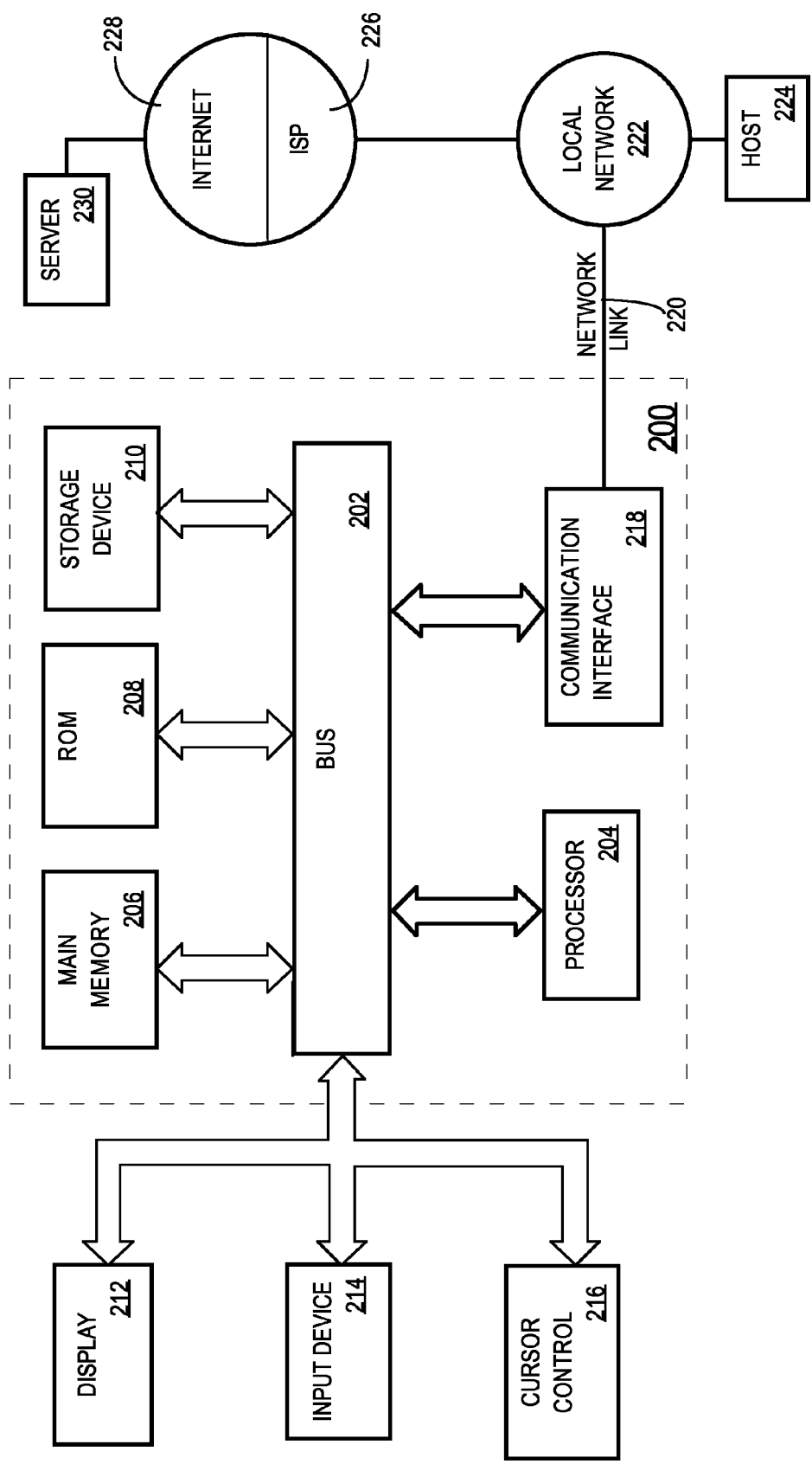
FIG. 2 depicts a computer system that may be used to implement an embodiment of the present invention.

For example, FIG. 2 is a block diagram that illustrates a computer system 200 upon which an embodiment of the invention may be implemented. Computer system 200 includes a bus 202 or other communication mechanism for communicating information, and a hardware processor 204 coupled with bus 202 for processing information. Hardware processor 204 may be, for example, a general purpose microprocessor.

Computer system 200 also includes a main memory 206, such as a random access memory (RAM) or other dynamic storage device, coupled to bus 202 for storing information and instructions to be executed by processor 204. Main memory 206 also may be used for storing temporary variables or other intermediate information during execution of instructions to be executed by processor 204. Such instructions, when stored in storage media accessible to processor 204, render computer system 200 into a special-purpose machine that is customized to perform the operations specified in the instructions.

Computer system 200 further includes a read only memory (ROM) 208 or other static storage device coupled to bus 202 for storing static information and instructions for processor 204. A storage device 210, such as a magnetic disk or optical disk, is provided and coupled to bus 202 for storing information and instructions.

Computer system 200 may be coupled via bus 202 to a display 212, such as a cathode ray tube (CRT), for displaying information to a computer user. An input device 214, including alphanumeric and other keys, is coupled to bus 202 for communicating information and command selections to processor 204. Another type of user input device is cursor control 216, such as a mouse, a trackball, or cursor direction keys for communicating direction information and command selections to processor 204 and for controlling cursor movement on display 212. This input device typically has two degrees of freedom in two axes, a first axis (e.g., x) and a second axis (e.g., y), that allows the device to specify positions in a plane.

Computer system 200 may implement the techniques described herein using customized hard-wired logic, one or more ASICs or FPGAs, firmware and/or program logic which in combination with the computer system causes or programs computer system 200 to be a special-purpose machine. According to one embodiment, the techniques herein are performed by computer system 200 in response to processor 204 executing one or more sequences of one or more instructions contained in main memory 206. Such instructions may be read into main memory 206 from another storage medium, such as storage device 210. Execution of the sequences of instructions contained in main memory 206 causes processor 204 to perform the process steps described herein. In alternative embodiments, hard-wired circuitry may be used in place of or in combination with software instructions.

The term "storage media" as used herein refers to any media that store data and/or instructions that cause a machine to operation in a specific fashion. Such storage media may comprise non-volatile media and/or volatile media. Non-volatile media includes, for example, optical or magnetic disks, such as storage device 210. Volatile media includes dynamic memory, such as main memory 206. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 202. Transmission media can also take the form of acoustic or light waves, such as those generated during radio-wave and infra-red data communications.

Various forms of media may be involved in carrying one or more sequences of one or more instructions to processor 204 for execution. For example, the instructions may initially be carried on a magnetic disk or solid state drive of a remote computer. The remote computer can load the instructions into its dynamic memory and send the instructions over a telephone line using a modem. A modem local to computer system 200 can receive the data on the telephone line and use an infra-red transmitter to convert the data to an infra-red signal. An infra-red detector can receive the data carried in the infra-red signal and appropriate circuitry can place the data on bus 202. Bus 202 carries the data to main memory 206, from which processor 204 retrieves and executes the instructions. The instructions received by main memory 206 may optionally be stored on storage device 210 either before or after execution by processor 204.

Computer system 200 also includes a communication interface 218 coupled to bus 202. Communication interface 218 provides a two-way data communication coupling to a network link 220 that is connected to a local network 222. For example, communication interface 218 may be an integrated services digital network (ISDN) card, cable modem, satellite modem, or a modem to provide a data communication connection to a corresponding type of telephone line. As another example, communication interface 218 may be a local area network (LAN) card to provide a data communication connection to a compatible LAN. Wireless links may also be implemented. In any such implementation, communication interface 218 sends and receives electrical, electromagnetic or optical signals that carry digital data streams representing various types of information.

Network link 220 typically provides data communication through one or more networks to other data devices. For example, network link 220 may provide a connection through local network 222 to a host computer 224 or to data equipment operated by an Internet Service Provider (ISP) 226. ISP 226 in turn provides data communication services through the world wide packet data communication network now commonly referred to as the "Internet" 228. Local network 222 and Internet 228 both use electrical, electromagnetic or optical signals that carry digital data streams. The signals through the various networks and the signals on network link 220 and through communication interface 218, which carry the digital data to and from computer system 200, are example forms of transmission media.

Computer system 200 can send messages and receive data, including program code, through the network(s), network link 220 and communication interface 218. In the Internet example, a server 230 might transmit a requested code for an application program through Internet 228, ISP 226, local network 222 and communication interface 218.

The received code may be executed by processor 204 as it is received, and/or stored in storage device 210, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense.

What is claimed is:

1. A method comprising steps of:
   loading each XML document of a plurality of XML documents into a table in which XML documents are stored in shredded form, wherein loading said each XML document comprises:
      generating column values of a plurality of columns, said column values to be stored in a plurality of rows in the table;
      analyzing said column values;
      based on said analyzing said column values, for each column of said plurality of columns, making a determination for said each column of a row-storage format, said making a determination for said each column of a row-storage format including:
         determining whether to store respective column values of said each column in column-major or row-major format, and
         determining whether to use a compression technique to compress said respective column values; and
      storing the column values into the table according to the determinations of the row-storage format made for said plurality of columns; and
   wherein said plurality of XML documents include a first XML document and a second XML document:
      wherein for said first XML document and for a particular column of said plurality of columns, said making a determination for said particular column of the row-storage format includes to store said particular column in column-major format; and
      wherein for said second XML document and for said particular column of said plurality of columns, said making a determination for said particular column of the row-storage format includes to store said particular column in row-major format.

2. The method of claim 1, wherein:
said plurality of XML documents include another XML document; and
wherein for said particular column of said plurality of columns, said determination of the row-storage format includes:
for said another XML document, said determination of the row-storage format includes to store said particular column in column-major format;
for said first XML document, said determination of the row-storage format includes to store the respective column values of said particular column using a first compression technique; and
for said other XML document, said making a determination of the row-storage format includes to store the respective column values of said particular column using another compression technique that is different than said first compression technique.

3. The method of claim 1,
wherein a database server manages access to said table, wherein the steps further include storing said plurality of XML documents in a second table;
wherein said plurality of columns of said table include:
a column that stores node values of nodes in said plurality of XML documents, and
a column that stores values that indicate a row in said second table that stores a XML document of said plurality of XML documents.

4. The method of claim 1, wherein said data for said table is stored in compression units.

5. The method of claim 1, wherein for said first XML document and for said particular column of said plurality of columns, said making a determination for said particular column of the row-storage format includes:
determining that particular columns values of said particular column have an identical value;
in response to determining that particular columns values in said particular column have an identical value, determining to use run length encoding to compress said particular column values.

6. The method of claim 5, wherein the particular column values are path identifiers or row identifiers.

7. The method of claim 1, wherein for said first XML document and for said particular column of said plurality of columns, said making a determination for said particular column of the row-storage format includes:
determining that particular columns values in said particular column share a common prefix; and
in response to determining that particular column values in said particular column share a common prefix, determining to use prefix encoding to compress said particular column values.

8. The method of claim 7, wherein said particular column values include path identifiers.

9. One or more non-transitory storage media storing instructions which, when executed by one or more computing devices, cause:
loading each XML document of a plurality of XML documents into a table in which XML documents are stored in shredded form, wherein loading said each XML document comprises:
generating column values of a plurality of columns, said column values to be stored in a plurality of rows in the table;
analyzing said column values;
based on said analyzing said column values, for each column of said plurality of columns, making a determination for said each column of a row-storage format, said making a determination for said each column of a row-storage format including:
determining whether to store respective column values of said each column in column-major or row-major format, and
determining whether to use a compression technique to compress said respective column values; and
storing the column values into the table according to the determinations of the row-storage format made for said plurality of columns; and
wherein said plurality of XML documents include a first XML document and a second XML document:
wherein for said first XML document and for a particular column of said plurality of columns, said making a determination for said particular column of the row-storage format includes to store said particular column in column-major format; and
wherein for said second XML document and for said particular column of said plurality of columns, said making a determination for said particular column of the row-storage format includes to store said particular column in row-major format.

10. The one or more non-transitory storage media of claim 9, wherein:
said plurality of XML documents include another XML document; and
wherein for said particular column of said plurality of columns, said determination of the row-storage format includes:
for said another XML document, said determination of the row-storage format includes to store said particular column in column-major format;
for said first XML document, said determination of the row-storage format includes to store the respective column values of said particular column using a first compression technique; and
for said other XML document, said making a determination of the row-storage format includes to store the respective column values of said particular column using another compression technique that is different than said first compression technique.

11. The one or more non-transitory storage media of claim 9,
wherein a database server manages access to said table, wherein the instructions include instructions that, when executed by said one or more computing devices, cause storing said plurality of XML documents in a second table;
wherein said plurality of columns of said table include:
a column that stores node values of nodes in said plurality of XML documents, and
a column that stores values that indicate a row in said second table that stores a XML document of said plurality of XML documents.

12. The one or more non-transitory storage media of claim 9, wherein said data for said table is stored in compression units.

13. The one or more non-transitory storage media of claim 9, wherein for said first XML document and for said particular column of said plurality of columns, said making a determination for said particular column of the row-storage format includes:
determining that particular columns values of said particular column have an identical value;

in response to determining that particular columns values in said particular column have an identical value, determining to use run length encoding to compress said particular column values.

14. The one or more non-transitory storage media of claim 13, wherein the particular column values are path identifiers or row identifiers.

15. The one or more non-transitory storage media of claim 9, wherein for said first XML document and for said particular column of said plurality of columns, said making a determination for said particular column of the row-storage format includes:
   determining that particular columns values in said particular column share a common prefix; and
   in response to determining that particular column values in said particular column share a common prefix, determining to use prefix encoding to compress said particular column values.

* * * * *

UNITED STATES PATENT AND TRADEMARK OFFICE
CERTIFICATE OF CORRECTION

| | |
|---|---|
| PATENT NO. | : 9,667,269 B2 |
| APPLICATION NO. | : 12/791337 |
| DATED | : May 30, 2017 |
| INVENTOR(S) | : Chandrasekar et al. |

Page 1 of 1

It is certified that error appears in the above-identified patent and that said Letters Patent is hereby corrected as shown below:

On the Title Page

Column 2, under Attorney, Agent, or Firm, Line 1, delete "Kickman" and insert -- Hickman --, therefor.

In the Specification

In Column 6, Line 21, delete "EXMAMPLE" and insert -- EXAMPLE --, therefor.

Signed and Sealed this
Twenty-seventh Day of March, 2018

Andrei Iancu
*Director of the United States Patent and Trademark Office*